(12) United States Patent
Chen et al.

(10) Patent No.: US 7,268,084 B2
(45) Date of Patent: Sep. 11, 2007

(54) METHOD FOR TREATING A SUBSTRATE

(75) Inventors: Lee Chen, Cedar Creek, TX (US);
Hitomitsu Kambara, Austin, TX (US);
Caiz Hong Tian, Osaka (JP); Tetsuya Nishizuka, Kobe (JP); Toshihisa Nozawa, Kobe (JP)

(73) Assignee: Tokyo Electron Limited, Tokyo (JP)

( * ) Notice: Subject to any disclaimer, the term of this patent is extended or adjusted under 35 U.S.C. 154(b) by 102 days.

(21) Appl. No.: 10/954,086

(22) Filed: Sep. 30, 2004

(65) Prior Publication Data

US 2006/0065629 A1    Mar. 30, 2006

(51) Int. Cl.
*H01L 21/302* (2006.01)
(52) U.S. Cl. .................. 438/710; 438/706; 156/345.3
(58) Field of Classification Search .............. 438/706, 438/710, 712, 714, 720; 156/345.3, 345.35, 156/34
See application file for complete search history.

(56) References Cited

U.S. PATENT DOCUMENTS

| | | | |
|---|---|---|---|
| 6,908,530 B2 * | 6/2005 | Huang et al. | 156/345.41 |
| 6,916,678 B2 * | 7/2005 | Kitagawa et al. | 438/58 |
| 2004/0040664 A1 * | 3/2004 | Yang et al. | 156/345.51 |
| 2004/0092047 A1 * | 5/2004 | Lymberopoulos et al. | 438/17 |
| 2004/0226511 A1 * | 11/2004 | Lai et al. | 118/723.001 |

* cited by examiner

*Primary Examiner*—Lan Vinh
(74) *Attorney, Agent, or Firm*—Oblon, Spivak, McClelland, Maier & Neustadt, P.C.

(57) ABSTRACT

A method of treating a substrate includes disposing the substrate in a processing chamber having a first chamber portion configured to define a plasma space and a second chamber portion configured to define a process space, introducing a first gas to the plasma space and introducing a second gas to the process space. A plasma is formed in the plasma space from the first gas using a plasma source coupled to the upper chamber portion, and a process chemistry for treating the substrate is formed in the process space by providing a grid positioned between the first chamber portion and the second chamber portion such that the plasma can diffuse from the plasma space to the process space.

38 Claims, 16 Drawing Sheets

METHOD FOR TREATING A SUBSTRATE

CROSS-REFERENCE TO RELATED APPLICATIONS

This application is related to co-pending U.S. patent application Ser. No. 10/953,802, entitled "Surface wave plasma processing system and method of using", filed on even date herewith; co-pending U.S. patent application Ser. No. 10/953,801, entitled "Plasma processing system for treating a substrate", filed on even date herewith; and co-pending U.S. patent application Ser. No. 10/953,791, entitled "Method and system for improving coupling between a surface wave plasma source and a plasma space", filed on even date herewith. The entire contents of all of those applications are herein incorporated by reference in their entirety.

BACKGROUND OF THE INVENTION

1. Field of the Invention

The present invention relates to a method and apparatus for treating a substrate, and more particularly to a method of controlling process chemistry in a plasma processing system.

2. Description of Related Art

Typically, during semiconductor processing, a (dry) plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a portion of the gas species present are ionized following a collision with an energetic electron. Moreover, the heated electrons serve to dissociate some species of the mixture gas species and create reactant specie(s) suitable for the exposed surface etch chemistry. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of substrate. Such substrate materials where etching is required include silicon dioxide ($SiO_2$), poly-silicon and silicon nitride, for example.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources. These conventional systems typically provide a single vacuum chamber space wherein the ionizable gas for creating the plasma is mixed with the dissociative gas used for processing. The present inventors have recognized, however, that these conventional plasma processing systems suffer from a number of deficiencies.

First, providing ionization and dissociative gas in a common chamber provides limited control of process chemistry (i.e., control of chemistry dissociation). Moreover, a common plasma and processing space exposes the plasma source to process gasses that may erode or deposit material on the plasma source thereby affecting the operation of the plasma source. Similarly, a common gas mixture space may cause substrate damage due to interaction of the substrate with energetic electrons and ions of the plasma. Still further, the inventor has recognized that the conventional systems are limited to conventional techniques for controlling substrate processing uniformity, such as controlling the temperature of the substrate to compensate for non-uniformity of the plasma and/or process gasses.

SUMMARY OF THE INVENTION

Accordingly, one object of an invention of the present application is to reduce or eliminate any or all of the above-described problems.

Another object of an invention of the present application is to provide a method and system for improving process chemistry control in a plasma processing system.

Another object of an invention of the present application is to provide a method and system for reducing damage to system components such as a plasma source, and/or to reduce the possibility of damage to a substrate being processed.

Yet another object of an invention of the present application is to provide a method and system for improving control of process uniformity to a substrate.

Any of these and/or other objects of the invention can be provided by a method of treating a substrate in a plasma processing system. According to one aspect of the invention, the method includes disposing the substrate in a processing chamber having a first chamber portion configured to define a plasma space and a second chamber portion configured to define a process space, introducing a first gas to the plasma space and introducing a second gas to the process space. A plasma is formed in the plasma space from the first gas using a plasma source coupled to the upper chamber portion, and a process chemistry for treating the substrate is formed in the process space by providing a grid positioned between the first chamber portion and the second chamber portion such that the plasma can diffuse from the plasma space to the process space.

According to another aspect of the invention, a method of treating a substrate in a plasma processing system includes disposing the substrate in a processing chamber having a first chamber portion configured to define a plasma space and a second chamber portion configured to define a process space, and providing a gas injection grid positioned between the first chamber portion and the second chamber portion. A first gas is introduced from the gas injection grid to the plasma space, and a second gas is introduced from the gas injection grid to the process space. A plasma is formed in the plasma space from the first gas using a plasma source coupled to the upper chamber portion. A process chemistry for treating the substrate in the process space by providing the gas injection grid positioned between the first chamber portion and the second chamber portion such that the plasma can diffuse from the plasma space to the process space.

DETAILED DESCRIPTION OF EXEMPLARY EMBODIMENTS

In the following description, to facilitate a thorough understanding of the invention and for purposes of explanation and not limitation, specific details are set forth, such as a particular geometry of the plasma processing system and various descriptions of the system components. However, it should be understood that the invention may be practiced with other embodiments that depart from these specific details. Nonetheless, it should be appreciated that, contained within the description are features which, notwithstanding the inventive nature of the general concepts being explained, are also of an inventive nature.

Figure 1:
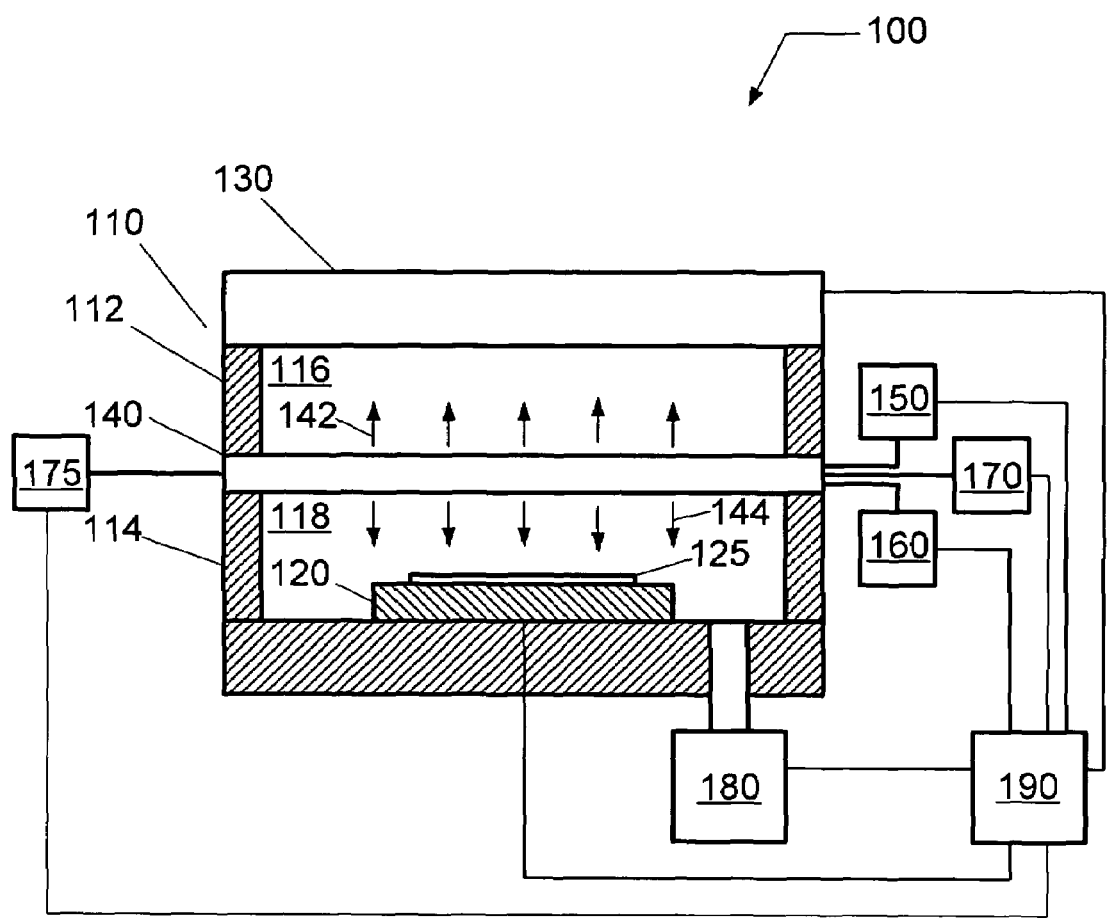
FIG. 1 presents a simplified schematic representation of a plasma processing system according to an embodiment of the invention.

Referring now to the drawings, wherein like reference numerals designate identical or corresponding parts throughout the several views, FIG. 1 illustrates a plasma processing system 100 according to an embodiment. The plasma processing system 100 comprises a processing chamber 110 having an upper chamber portion 112 (i.e. a first chamber portion) configured to define a plasma space 116, and a lower chamber portion 114 (i.e. a second chamber portion) configured to define a process space 118. In the lower chamber portion 114, the processing chamber 110 comprises a substrate holder 120 configured to support a substrate 125. Therein, the substrate 125 is exposed to process chemistry in process space 118. Furthermore, the plasma processing system 100 comprises a plasma source 130 coupled to the upper chamber portion 112, and configured to form plasma in the plasma space 116.

As seen in FIG. 1, the plasma processing system 100 comprises a grid 140 coupled to the upper chamber portion 112 and the lower chamber portion 114, and located between the plasma space 116 and the process space 118. While FIG. 1 shows the gas injection grid positioned centrally to divide the processing chamber such that the upper chamber portion 112 is substantially equal in size to the lower portion 114, the invention is not limited to this configuration. For example, the gas injection grid can be located within 200 mm from the upper surface of the substrate and, desirably, the gas injection grid is placed within a range of approximately 10 mm to approximately 150 mm from the upper surface of the substrate. The grid is preferably a gas injection grid 140 configured to introduce a first gas 142 to the plasma space 116 for forming plasma, and to introduce a second gas 144 to the process space 118 for forming process chemistry. However, it is not necessary for the first and second gasses to be introduced to their respective chamber portions by way of the grid 140. For example, the plasma source 130 may be configured to supply the first gas 142 to the plasma space 116. In embodiment of FIG. 1, a first gas supply system 150 is coupled to the gas injection grid 140, and it is configured to supply the first gas 142. Moreover, a second gas supply system 160 is coupled to the gas injection grid 140, and it is configured to supply the second gas 144. The temperature of the gas injection grid 140 can be controlled using a temperature control system 170, and the electric potential of the gas injection grid 140 can be controlled using an electric bias control system 175.

Furthermore, the plasma processing system 100 includes a pumping system 180 coupled to the processing chamber 110, and configured to evacuate the processing chamber 110, as well as control the pressure within the processing chamber 110. Optionally, the plasma processing system 100 further includes a control system 190 coupled to the processing chamber 110, substrate holder 120, plasma source 130, gas injection grid 140, the first gas supply system 150, the second gas supply system 160, the temperature control system 170, the electric bias control system 175, and the pumping system 180. The control system 190 can be configured to execute a process recipe for performing at least one of an etch process, and a deposition process in the plasma processing system 100.

Referring still to FIG. 1, the plasma processing system 100 may be configured to process 200 mm substrates, 300 mm substrates, or larger-sized substrates. In fact, it is contemplated that the plasma processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

As described above, the processing chamber 110 is configured to facilitate the generation of plasma in plasma space 116, and generate process chemistry in process space 118 adjacent a surface of the substrate 125. The first gas 142, which is introduced to the plasma space 116, comprises plasma forming gas, or an ionizable gas or mixture of gases. The first gas 142 can include an inert gas, such as a Noble gas. The second gas 144, which is introduced to the process space 118, comprises a process gas or mixture of process gases. For example, in an etch process, the process gas can include molecular constituents that when dissociated are reactive with the material being etched on the substrate surface. Once plasma is formed in the plasma space 116, some of the plasma can diffuse into the process space 118 through the gas injection grid 140. The heated electrons having diffused into the process space 118, can collide with molecules in the process gas causing dissociation and the formation of reactive radicals for performing an etch process, for example. The present inventors have discovered that this separation of the plasma space from the process space by a grid can provide several advantages over the conventional systems described above.

First, separate plasma and process spaces such as that shown in exemplary plasma processing system of FIG. 1 can provide improved process control over conventional systems. Specifically, the use of a gas injection grid 140, as described above, can, for example, affect the formation of a dense, high temperature (electron temperature, $T_e$) plasma in the plasma space 116, while producing a lower temperature plasma in the process space 118. In doing so, the split injection scheme for the first and second gases can affects a reduction in the dissociation of the molecular composition in the second gas that is utilized for forming the process chemistry, which provides greater control over the process at the substrate surface.

Additionally, the configuration of exemplary FIG. 1 can reduce damage to chamber components such as the plasma source 130, by preventing process gasses from entering the plasma space 116. For example, as an inert gas (first gas), such as argon (Ar), is introduced to the plasma space 116, plasma is formed and neutral Ar atoms are heated. The heated Ar neutral atoms diffuse downwards through the gas injection grid 140, and enter the cooler, process space proximate the substrate. This diffusion of neutral gas creates a gas flow into the process space 118 that can reduce or eliminate back-diffusion of the molecular composition in the process gas (second gas).

Still further, the configuration of FIG. 1 can reduce substrate damage caused by ion and electron interaction with the substrate 125. In particular, the diffusion of electrons and ions through the injection grid 140 into the process space 118 provides fewer electrons and ions in this space relative to the conventional chamber described above. Moreover, many of these electrons and ions give up their energy to the dissociation of the process gas. Thus, fewer electrons and ions are available to interact with the substrate and cause damage thereto this is particularly important for low temperature processes because damage to the substrate 125 may not be annealed by the required process temperature.

Thus, the present inventors have discovered that separation of plasma space from a process space by a grid may provide advantages over a mixed chamber configuration. It is to be understood however, that the present invention is not limited to providing all or any one of the above advantages. For example, the grid separation structure may provide unknown advantages that can be exploited to the exclusion of any one or all of the above described advantages.

Figure 2:
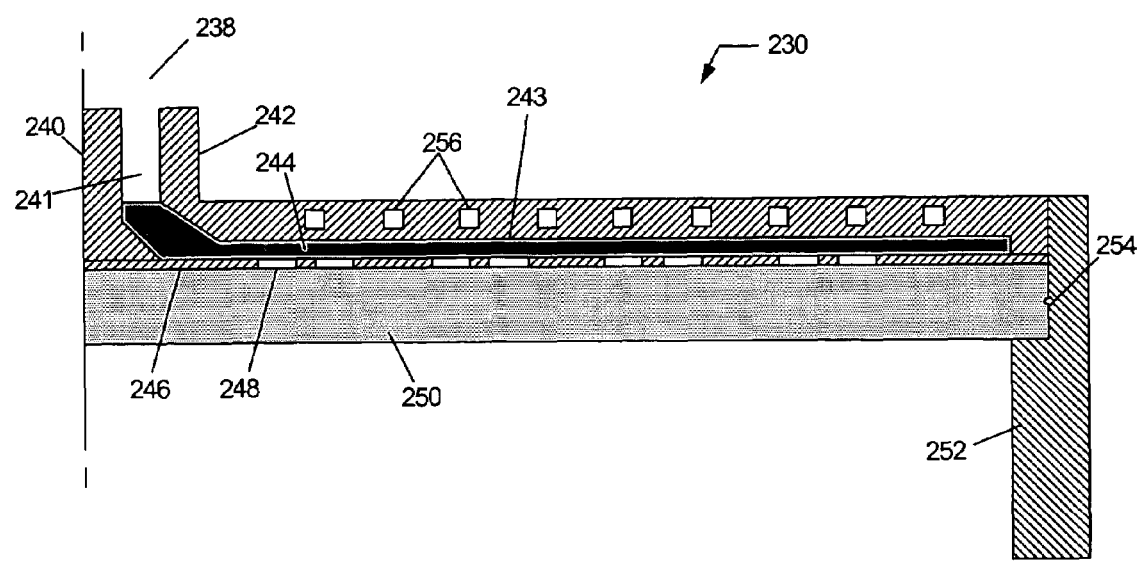
FIG. 2 presents a simplified schematic representation of a plasma source that can be used for the plasma processing system depicted in FIG. 1 in accordance with one embodiment.

Referring now to the plasma source 130 of FIG. 1, this source may be a parallel plate capacitively coupled plasma source, an inductively coupled plasma source, microwave plasma source (including those utilizing electron-cyclotron resonance (ECR), a helicon plasma source or a surface wave plasma (SWP) source, for example. As would be understood by one of ordinary skill in the art, other known plasma sources may be used. FIG. 2 shows a SWP source that may be used as the plasma source 130 of FIG. 1. Referring now to FIG. 2, a plasma source 230 is illustrated comprising a slot antenna, such as a radial line slot antenna (RLSA), with a coaxial feed 238 having an inner conductor 240, an outer conductor 242, and insulation 241. A fluid channel 256 can be used to flow a temperature control fluid for temperature control of the plasma source 230.

Additionally, the plasma source 230 includes an electromagnetic (EM) wave launcher 243 comprising a slow wave plate 244, a slot antenna 246 having slots 248, and a resonator plate 250. The number of slots, geometry of the slots, the size of the slots, and the distribution of the slots are all factors that can contribute to the spatial uniformity of the plasma formed in plasma space 116. Thus, the design of the slot antenna 246 may be used to control the spatial uniformity of the plasma in the plasma space 116. Moreover the exact dimensions of the resonator plate 250 (i.e., thickness, and diameter) can be calculated numerically for a desired microwave frequency. These critical dimensions of the resonator plate 250 make this component expensive to produce.

The wave launcher 243 includes a microwave launcher configured to radiate microwave power into plasma space 116. The microwave launcher can be coupled to a microwave source, such as a 2.45 GHz microwave power source, wherein microwave power is coupled to the microwave launcher via the coaxial feed 238. Microwave energy generated by the microwave source is guided through a waveguide (not shown) to an isolator (not shown) for absorbing microwave energy reflected back to the microwave oscillator, and thereafter it is converted to a coaxial TEM mode via a coaxial converter (not shown). A tuner may be employed for impedance matching, and improved power transfer. The microwave energy is coupled to the microwave launcher via the coaxial feed 238, where another mode change occurs from the TEM mode in the coaxial feed 238 to a TM mode. Additional details regarding the design of the coaxial feed and the wave launcher can be found in U.S. Pat. No. 5,024,716, entitled "Plasma processing apparatus for etching, ashing, and film-formation"; the contents of which are herein incorporated by reference in its entirety.

Referring still to FIG. 2, the plasma source 230 is coupled to the upper chamber portion 112 of processing chamber 110, wherein a vacuum seal can be formed between the upper chamber wall 252 and the plasma source 230 using a sealing device 254. The sealing device 254 can include an elastomer O-ring, however, other known sealing mechanisms may be used.

In general, the inner conductor 240 and the outer conductor 242 of the coaxial feed 238 comprise a conductive material, such as a metal, while the slow wave plate 244 and the resonator plate 250 comprise a dielectric material. In the latter, the slow wave plate 244 and the resonator plate 250 preferably comprise the same material, however different materials may be used. The material selected for fabrication of the slow wave plate 244 and the resonator plate 250 is chosen to reduce the wavelength of the propagating electromagnetic (EM) wave relative to the free-space wavelength, and the dimensions of the slow wave plate 244 and the resonator plate 250 are chosen to ensure the formation of a standing wave effective for radiating EM energy into the plasma space 116.

In one embodiment, the slow wave plate 244 and the resonator plate 250 are fabricated from quartz (silicon dioxide).ln particularl, when the plasma processing system is utilized for etch process applications, quartz is often chosen for compatibility with the etch process. However, the present inventors have observed several problems with using quartz as the material of the slow wave plate 244 and the resonator plate 250.

Figure 3:
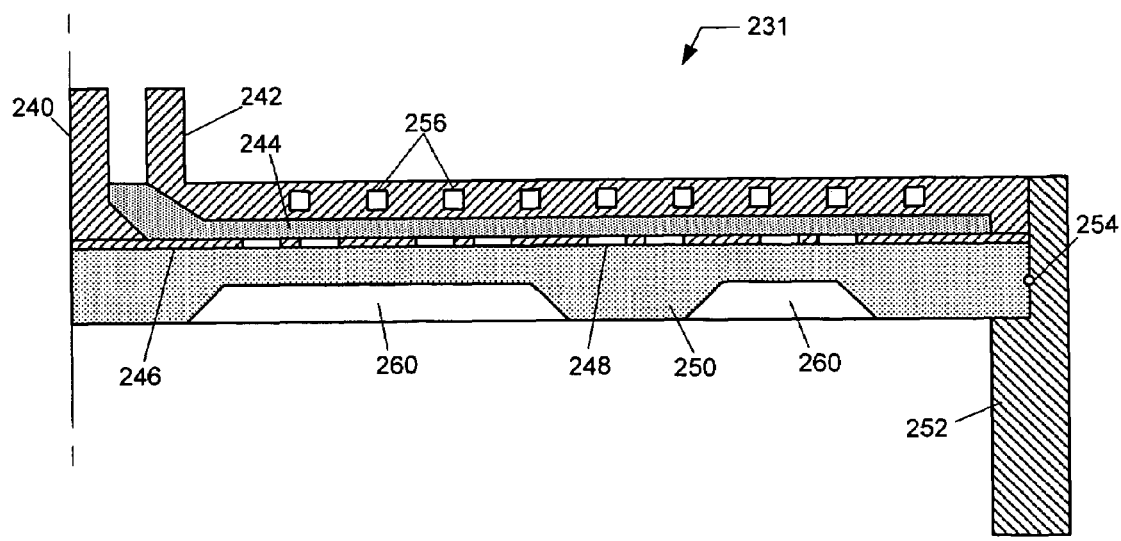
FIG. 3 presents another simplified schematic representation of a plasma source that can be used for the plasma processing system depicted in FIG. 1 in accordance with another embodiment.

The onset of the standing wave electric field must remain adjacent the quartz-plasma interface for low power plasma processes. The present inventors have observed that the use of a quartz resonator plate with the standing wave at the quartz-plasma interface can be prone to mode jumps as plasma parameters shift. Specifically, shifts in plasma parameters affect the decaying electric field in the quartz resonator. If the electric field strength in the dielectric resonator is not sufficiently larger than the change in the electric field due to the shift in plasma parameters, such a shift can cause a voltage standing wave ratio (VSWR) jump, or standing wave mode jump. Also, when using quartz as the material for the manufacture of the resonator plate and the slow wave plate, the design of the slot antenna (i.e., number of slots, their size, geometry and distribution) is less effective for affecting spatially uniform plasma in the plasma space 116. Therefore, a special shape can be required for forming uniform plasma. FIG. 3 shows a plasma source 231 that can further include one or more concentric grooves 260 configured to improve the spatial uniformity of plasma in the plasma space 116. However, this configuration can increase the cost of the quartz resonator plate.

In another embodiment of the present invention, the slow wave plate 244 and the resonator plate 250 can be fabricated from a high dielectric constant (high-k) material. As used herein, "high dielectric constant" and "high-k" material refer to materials having a dielectric constant equal to or greater than that of silicon dioxide (approximately a value of 3.9). The present inventors have recognized that the use of a high-k material can, for example, lead to reduced risk of mode jumping due to shifts in plasma parameters relative to other materials such as quartz described above. Moreover, use of the high-k material causes the design of the slot antenna to have improved effectiveness in controlling the spatial uniformity of plasma formed in plasma space 116. Still further, use of a high-k material can allow reduced dissociation of the molecular constituent in the process chemistry, thereby allowing greater process control as discussed above with respect to FIG. 1. In this regard, the present inventors have recognized that the use of a high-k material for the slow wave plate 244 and the resonator plate 250 can improve process control in conventional single chamber plasma chambers as well as the split chamber configuration of exemplary FIG. 1.

In one embodiment, the high-k material can include intrinsic crystal silicon, alumina ceramic, aluminum nitride, and sapphire. However, other high-k materials may be used in accordance with the present invention. Moreover, a particular high-k material may be selected in accordance with the parameters of a particular process. For example, when the resonator plate 250 is fabricated from intrinsic crystal silicon, the plasma frequency exceeds 2.45 GHz at a temperature of 45 C. Therefore, intrinsic crystal silicon is appropriate for low temperature processes (i.e., less than 45 C). For higher temperature processes, the resonator plate 250 can be fabricated from alumina ($Al_2O_3$), or sapphire.

As described above, the resonator plate of the plasma source has critical dimensions, which makes the resonator plate expensive. This is true of quartz resonator plates as well as resonator plates made of the high-k materials described above. However, the erosive nature of plasma in plasma space 116 may cause the resonator plate 250 to deviate from its critical dimensions thereby requiring frequent replacement of the expensive resonator plate 250. This is particularly true for conventional single chamber plasma systems wherein the resonator plate is exposed to process gasses as well as the plasma. The present inventors have recognized that, due to the erosive plasma and the requirement for maintaining critical dimensions of the resonator plate 250, a cover plate can be used as a consumable component to protect the more expensive resonator plate 250.

Figure 4:
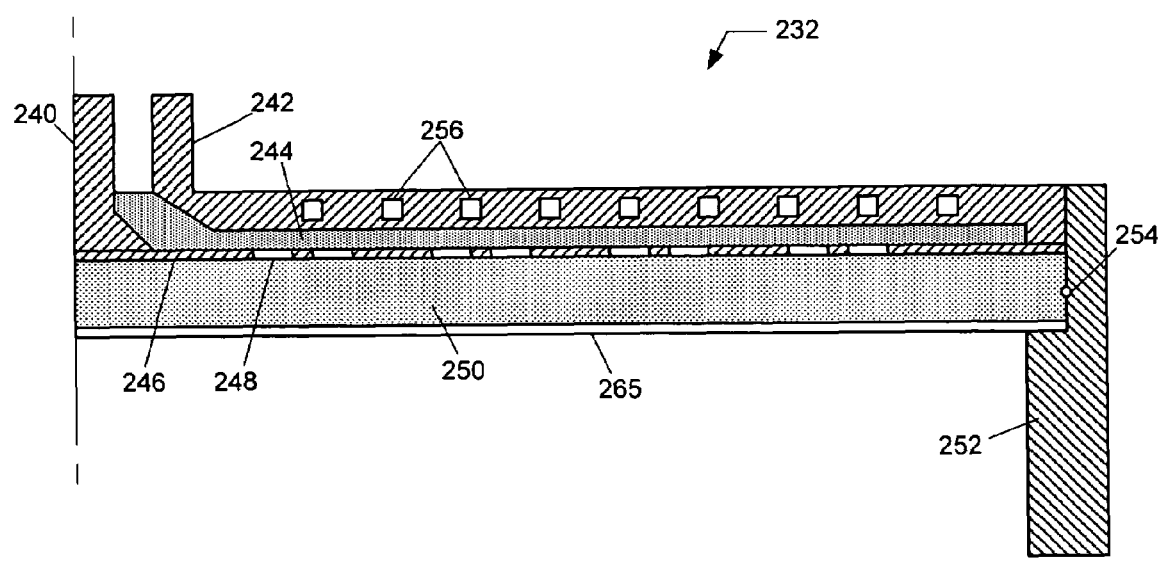
FIG. 4 presents another simplified schematic representation of a plasma source that can be used for the plasma processing system depicted in FIG. 1 in accordance with another embodiment.

Thus, according to yet another example, a cover plate 265 is coupled to a lower surface of the resonator plate 250 as illustrated in FIG. 4. The cover plate thickness is selected to be sufficiently thin such that it does not support standing wave modes within it (i.e., the thickness is not electromagnetically critical); however, it is sufficiently thick for mechanical stability. For example, the cover plate 265 can include a quartz cover plate that is 1 to 5 mm in thickness, or desirably 2 to 3 mm in thickness. Furthermore, the lower surface (or contact surface) of the resonator plate 250 and the upper surface (or contact surface) of the cover plate 265 can be polished to ensure a good contact between the resonator plate 250 and the cover plate 265. A thin film may also be deposited on the lower surface of the resonator plate 250, and polished in order to provide a good contact. For instance, the thin film can include a thin film of $SiO_2$, and it may include up to 2 micron thermal $SiO_2$, or up to 6 micron physical vapor deposition (PVD) $SiO_2$. As would be understood by one of ordinary skill in the art, the cover plate 265 is preferably coupled to the resonator plate by fasteners or some other mechanism for allowing removal and replacement of the cover plate 265.

Figure 9A:
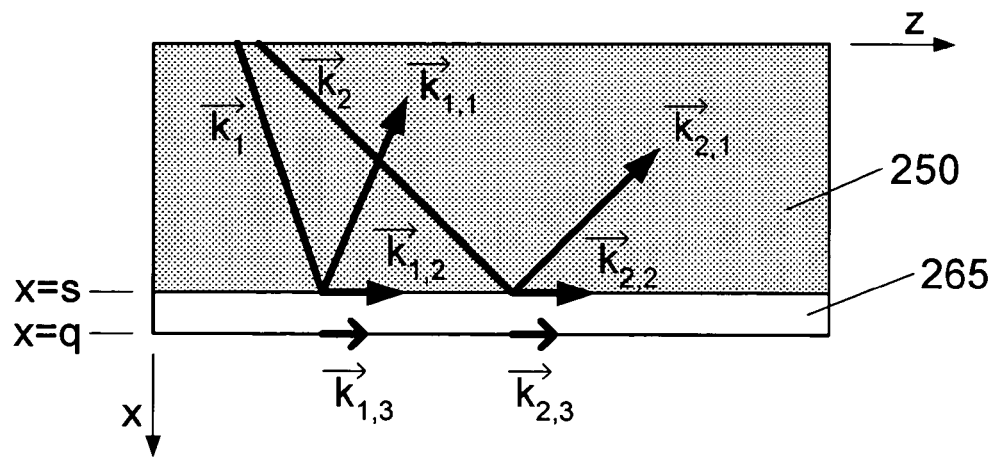
FIGS. 9A and 9B provide schematic representations of electromagnetic wave propagation in a medium.

Notwithstanding the benefit of the cover plate 265 in providing erosion protection for the expensive resonator plate component, the present inventor has discovered that the cover plate may contribute to instability of the plasma in a plasma processing system, such as the plasma system of FIG. 1 or conventional single chamber plasma systems. FIG. 9A shows an infinite slab model depicting a simple geometric interface for the resonator plate 250 and the cover plate 265. Analytical expressions of the electric and magnetic fields can be determined using the homogeneous Helmholtz equation, viz.

$$E_z = A\sin(k_{250}x)e^{-j\beta z}, \tag{1}$$

$$E_x = -j\frac{\beta}{k_{250}}A\cos(k_{250}x)e^{-j\beta z}, \text{ and} \tag{2}$$

$$H_y = -j\frac{\kappa_{250}k_0 Y_0}{k_{250}}A\cos(k_{250}x)e^{-j\beta z}, \tag{3}$$

where x, y, and z are the Cartesian coordinates as shown in FIG. 9A, $E_z$ is the electric field in the z direction, $E_x$ is the electric field in the x direction, $H_y$ is the magnetic field in the y direction, $k_{250}$ is the cut-off wave number in the resonator plate, $\kappa_{250}$ is the dielectric constant of the resonator plate material and $Y_0$ is the vacuum wave admittance ($Y_0=(\epsilon_0/\mu_0)^{1/2}=Z_0^{-1}$). Also in the above equation, $\beta$ is the propagation constant from the basic dispersion relation $\beta^2=k^2-k_c^2=\kappa_{250}k_0^2-k_{250}^2=\kappa_{265}k_0^2+h^2$, where $\kappa_{265}$ is the dielectric constant of the cover plate material, k is the medium wave number, $k_c$ is the medium cut-off wave number, h is the field damping constant, $k_0$ is the vacuum wave number and $k_{265}=jh$. Thus, where the resonator plate is fabricated from intrinsic crystal silicon and the cover plate is fabricated from silicon dioxide, the subscript "250" refers to the material properties of intrinsic crystal silicon, and the subscript "265" refers to the material properties of silicon dioxide.

As shown in FIG. 9A, the primary surface wave exists between the resonator plate and cover plate interface, and the onset of the evanescent electric field occurs at this interface. Electromagnetic waves, represented by $k_1$ and $k_2$, are depicted as two exemplary modes in FIG. 9A. Waves $k_{1,2}$ and $k_{2,2}$ represent the surface waves at this interface, traveling with a phase velocity between the phase velocity in intrinsic crystal silicon (e.g., $\kappa \sim 12$, and $\lambda_{Si} \sim 1$ cm), and the phase velocity in silicon dioxide ($\kappa \sim 4$, and $\lambda_{SiO2} \sim 3$ cm). If the thickness of the cover plate is much larger than the wavelength of the EM wave, then the infinite slab model field solutions for x>s are:

$$E_z = A\sin(k_{250}s)e^{-hx}e^{hs}e^{-j\beta z}, \qquad (4)$$

$$E_x = -j\frac{\beta}{h}\sin(k_{250}s)e^{-hx}e^{hs}e^{-j\beta z}, \text{ and} \qquad (5)$$

$$H_y = -j\frac{\kappa_{265}k_0Y_0}{h}A\sin(k_{250}s)e^{-hx}e^{hs}e^{-j\beta z}, \qquad (6)$$

(where $kY=k_0Y_0$, when in vacuum; and $kY=\kappa_{265}k_0Y_0$, for a surface wave in the cover plate).

However, since the thickness of the cover plate is only a fraction of the wavelength and, hence, a smaller fraction of the decay depth of the electric field, the above set of solutions are incomplete. For instance, an additional reflection at the interface between the cover plate and the plasma will occur, and there will exist a different decay constant for x>q. Since the propagation constant will have to be the same for the resonator plate, the cover plate, and the plasma, there will exist a new β. More importantly, the new β leads to a new phase velocity straddling that in the resonator plate, the cover plate, and the plasma.

Therefore, as a result of the cover plate, it is possible that plasma instability can occur as a result of a shift in plasma parameters. Although the dielectric constant for the plasma is approximately a value of unity for a wide range of plasma parameters, EM wave dispersion is strongly affected by the electron density ($n_e$), the electron temperature ($T_e$), etc. When the dispersion relation changes in the plasma, the surface wave propagation constant changes. Consequently, the field solutions change. The immediate consequence can include an increase in the VSWR, and a possible mode jump that reduces the stability of the plasma processing chamber thereby diminishing the repeatability of processing performed in the plasma processing system. While such mode hops may be present without a cover plate, the possibility of increased instability in the plasma might be a factor contributing to the current failure to use consumable cover plate on surface wave plasma sources.

However, the present inventors have discovered that a mode scrambler can be coupled to the plasma source in order to mitigate the effects of mode jumping. Specifically, the cavity mode in the wave launcher 243 can be dependent upon the geometry of the wave launcher cavity and the material properties of the wave launcher cavity, as well as upon the plasma parameters. The use of a mode scrambler reduces the effect of changes in the plasma parameters on the resultant cavity mode. In this regard, the mode scrambler may be provided to facilitate use of a protective cover 265 that may otherwise not be used due to the possibility of causing mode hops as discussed above. This is true for conventional plasma systems as well as the system of FIG. 1 discussed above. Moreover, the mode scrambler may be used to suppress mode hopping for SWP sources having a cover plate or not having a cover plate.

Figure 5:
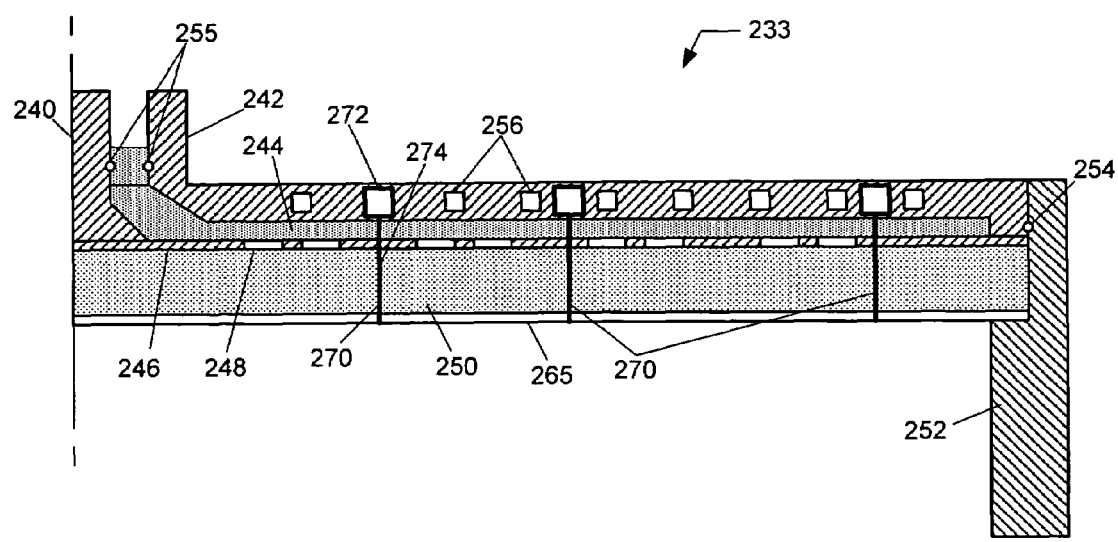
FIG. 5 presents another simplified schematic representation of a plasma source that can be used for the plasma processing system depicted in FIG. 1 in accordance with yet another embodiment.

FIG. 5 shows a mode scrambler coupled to a lower surface of the resonator plate according to one embodiment of a plasma source. As seen in this figure, the mode scrambler 270 comprises one or more gas holes 274 coupled to one or more gas plenums 272. In the embodiment of FIG. 5, the gas plenums 272 are coupled to the plasma space 116 by the gas holes 274 such that a gas, such as the first gas or an inert gas, is introduced to the plasma space 116. Although each of the gas holes 274 in FIG. 5 are shown to be coupled to a gas plenum 272, one or more of the one or more gas holes 274 may not be coupled to a gas plenum 272. Further, in one embodiment, one or more of the one or more gas holes 274 can be evacuated.

Referring still to FIG. 5, the plasma source 233 is coupled to the upper chamber portion 116 of processing chamber 110, wherein a vacuum seal can be formed between the upper chamber wall 252 and the plasma source 230 using a sealing device 254. The sealing device 254 can include an elastomer O-ring, however, other known sealing devices may be used. Furthermore, a second and third sealing device, 255A and 255B, can be utilized to provide a vacuum seal in the coaxial feed 238.

Figure 6:
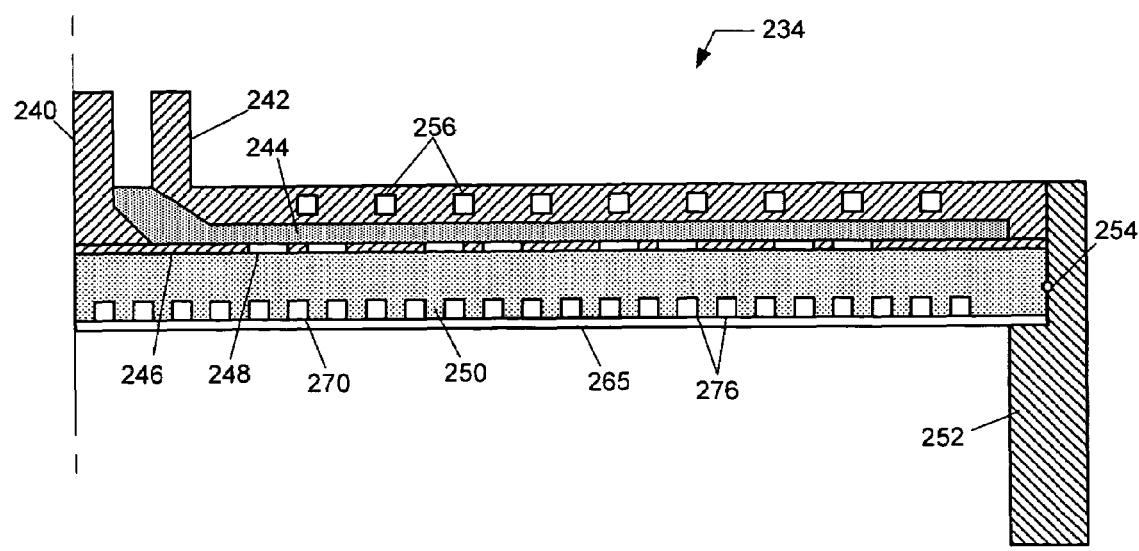
FIG. 6 presents another simplified schematic representation of a plasma source that can be used for the plasma processing system depicted in FIG. 1 in accordance with another embodiment.
Figure 9B:
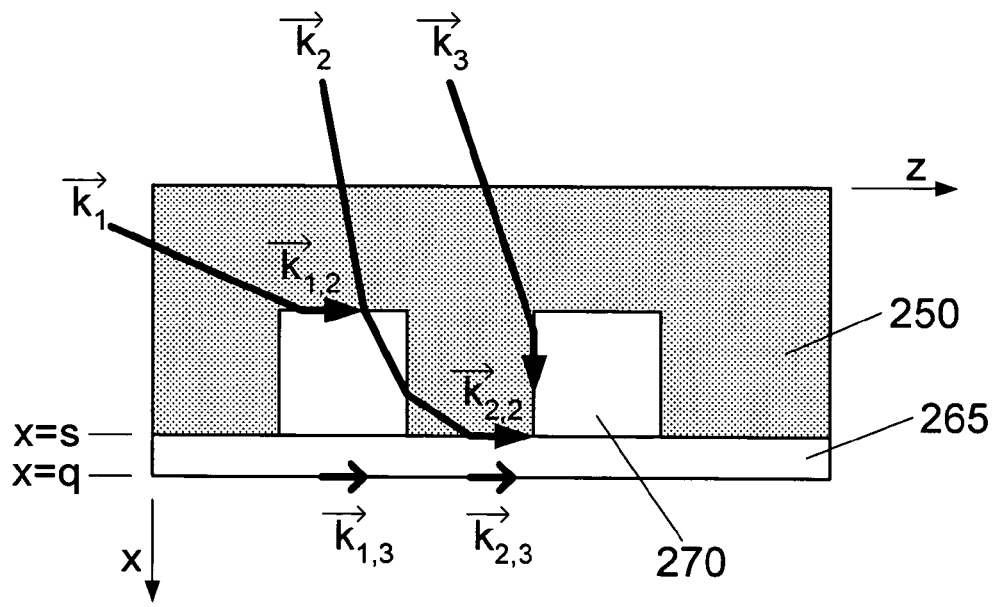

FIG. 6 illustrates a plasma source according to yet another example. As seen in this figure, a mode scrambler 270 is coupled to a lower surface of the resonator plate 250 in plasma source 233. Herein, the mode scrambler 270 comprises one or more blind holes 276 formed at an interface of the cover plate 265 and the resonator plate 250. FIG. 9B shows an infinite slab model depicting a simple geometric interface for blind holes 276 formed between the resonator plate 250 and the cover plate 265. As seen in FIG. 9B, electromagnetic waves, represented by $k_1$, $k_2$, and $k_3$, are depicted as three exemplary modes. Surface waves $k_{1,2}$ ($k_{1,3}$) and $k_{2,2}$ ($k_{2,3}$) represent effective coupling of energy to plasma in plasma space 116. However, wave $k_3$ does not contribute to plasma heating, and it is reflected by the plasma. The present inventors have determined that this reflection of certain modes of electromagnetic waves diminishes the possibility of mode hopping that may occur in the SWP source and may be enhanced by the cover plate 265.

The number, geometry, distribution, and size of the one or more blind holes 276 can also be selected in order to provide uniform plasma in plasma space 116. Thus, the mode scrambler can be used to provide additional control of plasma uniformity. Additionally, the one or more blind holes 276 can be opened to the plasma space 116 rather than sealed from the plasma as seen in FIG. 6. In such a configuration, however, the size of each blind hole, such as the width or diameter of each hole, should be sufficiently small so as to avoid the formation of plasma in the hole which can contribute to mode hopping. If plasma is permitted to form in one or more holes, then the one or more holes can be subjected to erosion by the plasma, hence, damaging the hole and changing the hole dimensions. These changes in the hole dimensions can lead to changes in the coupling of power between the plasma source and plasma. For example, the width or diameter of each blind hole can be less than or equal to 2 mm for process pressures less than 100 mTorr. As the pressure is increased, the size of the blind hole should be decreased in order to prevent the formation of plasma therein (e.g., when p=200 mTorr, the diameter should be less than or equal to 1 mm). Additionally, for example, a blind hole diameter of less than 1 mm can be effective for scrambling cavity modes for $\lambda_{Si} \sim 1$ cm.

The one or more blind holes can be fabricated using drilling or milling techniques, sonic milling, laser milling, or etching processes, or any combination thereof. The etching processes can include dry or wet etching processes that can be utilized for forming the blind hole in the resonator plate 250. In one embodiment, a thin $SiO_2$ layer, such as a 2 micron layer of thermal $SiO_2$ or a 6 micron layer of physical vapor deposition (PVD) $SiO_2$, can be deposited on the lower surface of the resonator plate 250. Thereafter, the thin $SiO_2$ layer can be patterned using, for example, an etching process, and the pattern can be transferred into the resonator plate 250 using an etching process, whereby the thin $SiO_2$ layer serves as a hard mask and defines the geometry of the one or more blind holes. Furthermore, the remaining thin $SiO_2$ layer can serve to ensure a good interface between the resonator plate 250 and the cover plate 265.

Figure 7:
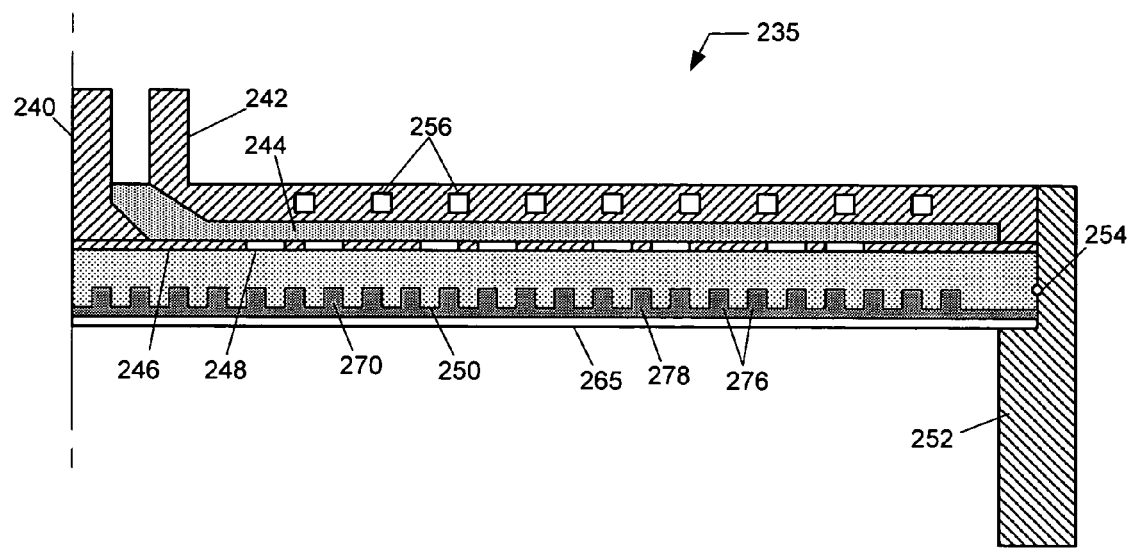
FIG. 7 presents another simplified schematic representation of a plasma source that can be used for the plasma processing system depicted in FIG. 1 in accordance with a further embodiment.

According to yet another example of the plasma source, the blind holes 276 of the mode scrambler depicted in FIG. 6 can be filled with a material in order to prevent the formation of plasma within the holes. For example, referring to FIG. 7, a coating 278 can be applied to the lower surface of the resonator plate 250 in order to fill the one or more blind holes 276. The coating 278 preferably comprises a material having a dielectric constant less than the dielectric constant of the resonator plate 250. For example, where the resonator plate is a high-k material, the coating 278 can include $SiO_2$ having a dielectric constant of approximately 4. Alternatively, the coating can include a low dielectric constant (low-k) material, having a dielectric constant less than that of $SiO_2$. Moreover, the coating 278 can preferably include a low-k material, having a coefficient of thermal expansion that is compatible with the expansion coefficient for the resonator plate in order to improve reliability of the interface between the resonator plate 250 and the cover plate 265. For example, the low-k material can include at least one of an organic, inorganic, and inorganic-organic hybrid material. Furthermore, the low-k material can include a porous, or non-porous coating.

Additionally, for example, the coating 278 may include an inorganic, silicate-based material, such as oxidized organosilane (or organo siloxane), deposited using CVD techniques. Examples of such coatings include Black Diamond™ CVD organosilicate glass (OSG) films commercially available from Applied Materials, Inc., or Coral™ CVD films commercially available from Novellus Systems. The coating 278 can also include single-phase materials, such as a silicon oxide-based matrix having $CH_3$ bonds that are broken during a curing process to create small voids (or pores), and/or dual-phase materials such as a silicon oxide-based matrix having pores of organic material (e.g., porogen) that is evaporated during a curing process. Alternatively, the coating 278 may include an inorganic, silicate-based material, such as hydrogen silsesquioxane (HSQ) or methyl silsesquioxane (MSQ), deposited using SOD techniques. Examples of such coatings include FOx HSQ commercially available from Dow Corning, XLK porous HSQ commercially available from Dow Corning, and JSR LKD-5109 commercially available from JSR Microelectronics. Still alternatively, the coating 278 can include an organic material deposited using SOD techniques. Examples of such coatings include SiLK-I, SiLK-J, SiLK-H, SiLK-D, and porous SiLK semiconductor dielectric resins commercially available from Dow Chemical, and FLARE™, and Nano-glass commercially available from Honeywell.

The coating 278 can be formed, for example, using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a coating on a substrate are well known to those skilled in the art of both spin-on technology and vapor deposition technology. Once the coating 278 is applied, it can be polished in order to, for example, provide an improved interface with the cover plate 265. The polishing process can, for instance, include chemical-mechanical polishing (CMP).

Figure 8:
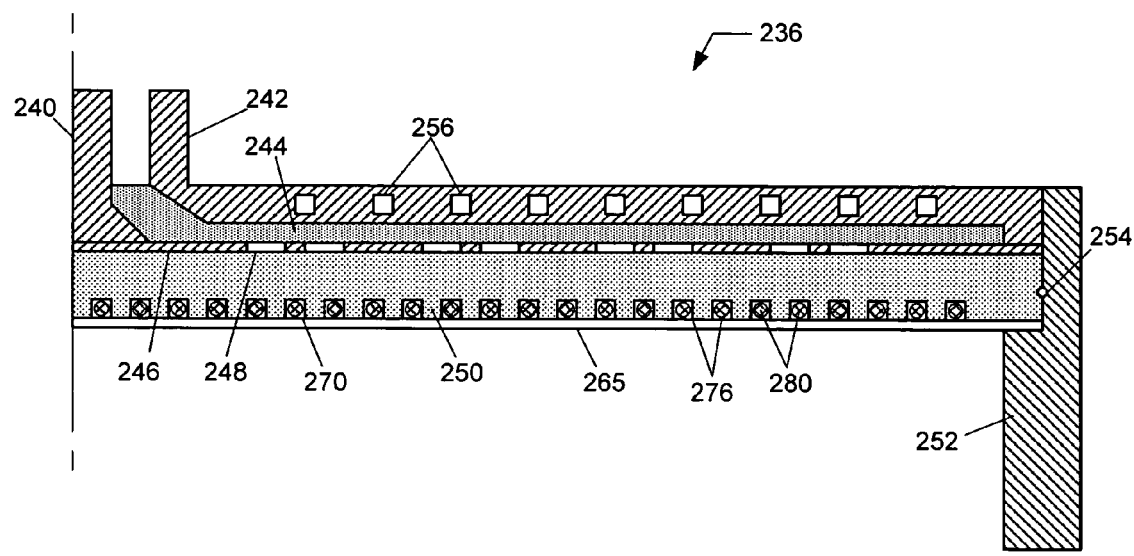
FIG. 8 presents another simplified schematic representation of a plasma source that can be used for the plasma processing system depicted in FIG. 1 in accordance with still another embodiment.

According to yet another example of a plasma source, the mode scrambler 270 having one or more blind holes 276 can be filled with a plasma arrester in order to prevent the formation of plasma in the blind holes. For example, referring to FIG. 8, the one or more blind holes 276 are filled with a spherical pellet 280. The spherical pellets 280 can, for example, comprise $SiO_2$, or a low-k material, as described above. Once the one or more blind holes are loaded with the spherical pellets 280, each pellet is secured by press-fitting each pellet into each blind hole or by retaining each pellet within the blind hole by coupling the cover plate 265 to the resonator plate 250. The pellet's physical presence reduces the accelerated free electron path (electrons collide into pellet), thus, inhibiting avalanche ionization. In one example, each blind hole 276 can include a 2 mm diameter by a 2 mm depth, and each pellet 280 can have a diameter of 2 mm, and less (such that it is sufficiently small to fit within the blind hole). Additionally, in order to ensure a good interface between the resonator plate 250 and the cover plate 265, a thin $SiO_2$ layer, such as a 2 micron layer of thermal $SiO_2$ or a 6 micron layer of physical vapor deposition (PVD) $SiO_2$, can be deposited on the contact surfaces of the resonator plate 250.

Figure 10:
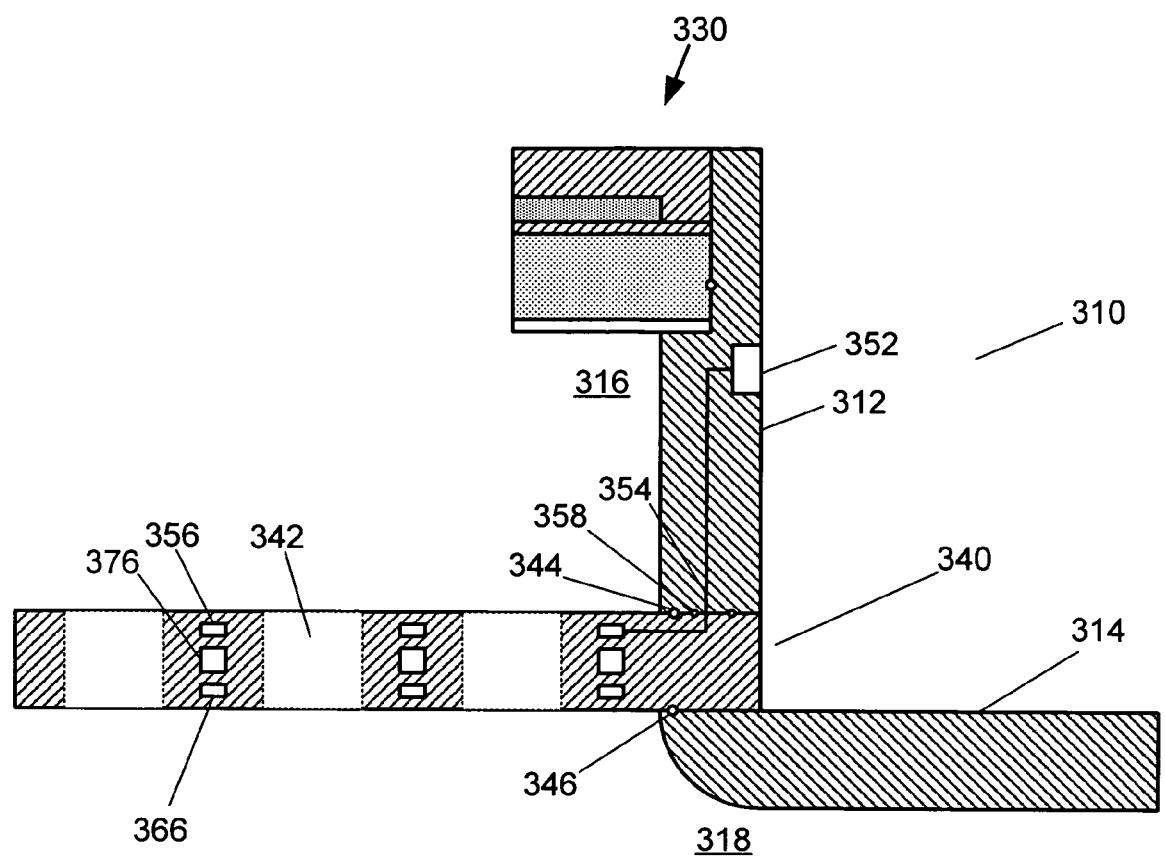
FIG. 10 provides an exploded view of a portion of a processing chamber according to an embodiment.

As indicated above, the grid 140 of FIG. 1 may be configured to control process uniformity in the plasma processing system. Specifically, the grid 140 may be implemented as a gas injection grid for introducing the first and second gasses. FIG. 10 illustrates a portion of a processing system showing details of a gas injection grid in accordance with one embodiment. A processing chamber 310 is depicted comprising an upper chamber portion 312 that encloses a plasma space 316, and a lower chamber portion 314 that encloses a process region 318. A plasma source 330, such as a surface wave plasma source as described above, is coupled to the upper chamber portion 312, and is configured to form plasma in plasma space 316. A gas injection grid 340 is coupled to the upper chamber portion 312 and the lower chamber portion 314, and located between the plasma space 316 and the process space 318. As illustrated in FIG. 10, the gas injection grid 340 is coupled to the upper chamber portion 312, and it is sealed for use in vacuum using an upper sealing device 344, such as an elastomer O-ring. Also, as illustrated in FIG. 10, the gas injection grid 340 is coupled to the lower chamber portion 314, and it is sealed for use in vacuum using a lower sealing device 346, such as an elastomer O-ring.

The gas injection grid 340 comprises one or more passageways 342 coupling the plasma space 316 to the process space 318 that allow plasma to diffuse into the process space 318. In the embodiment of FIG. 10, gas injection grid 340 is configured to introduce a first gas to the plasma space 316 through one or more gas injection orifices (not shown) that are coupled to a first gas channel array 356. The first gas channel array 356 can include one gas channel coupled to a first gas supply system, or a plurality of gas channels forming multiple zones in the gas injection grid 340 that are independently coupled to the first gas supply system. In the latter, the composition of the first gas, or the flow rate of the first gas, or both can be varied from one gas channel to the next. By such variation, a condition of the plasma in plasma space 316 can be spatially controlled to achieve spatial uniformity or non-uniformity as desired. For example, spatial uniformity of the plasma may be used to maintain process uniformity, and non-uniformity of the plasma may be used to compensate for other conditions in the processing system.

As also seen in the embodiment of FIG. 10, gas injection grid 340 is configured to introduce a second gas to the process space 318 through one or more gas injection orifices (not shown) that are coupled to a second gas channel array 366. The second gas channel array 366 can include one gas channel coupled to a second gas supply system, or a plurality of gas channels independently coupled to the second gas supply system. In the latter, the composition of the second gas, or the flow rate of the second gas, or both can be varied from one gas channel to the next. As with the first gas, such variation can be used to provide spatial control of the process gas space to achieve spatial uniformity or non-uniformity as desired.

Also in the embodiment of FIG. 10, the temperature of the gas injection grid 340 can be controlled by circulating a heat transfer fluid through a fluid channel array 376 in order to transfer heat from the gas injection grid 340 to a heat exchanger (not shown) when cooling, or to transfer heat to the gas injection grid 340 from the heat exchanger when heating. The fluid channel array 376 can include one fluid channel coupled to a temperature control system, or a plurality of fluid channels independently coupled to the temperature control system. In the latter, the composition of the heat transfer fluid, or the temperature of the heat transfer fluid, or the flow rate of the heat transfer fluid, or any combination thereof can be varied from one fluid channel to the next. Thus, the fluid channel array 376 can also be used to provide spatial control of the plasma and process spaces.

As illustrated in FIG. 10, the first gas is coupled to the first gas channel array 356 via a first array of gas lines 354. The first gas is coupled to the first array of gas lines 354 through a first array of gas fittings 352, which permits a point for coupling a first gas supply system, such as the first gas supply system 150 depicted in FIG. 1. For example, the first array of gas fittings 352 can be located in the upper chamber portion 312, and the first array of gas lines 354 can pass through the upper chamber portion 312 into the gas injection grid 340, whereby a first array of gas sealing devices 358 are utilized to prevent leakage of the first gas. For example, the first array of gas sealing devices 358 can include one or more elastomer O-rings.

Figure 11:
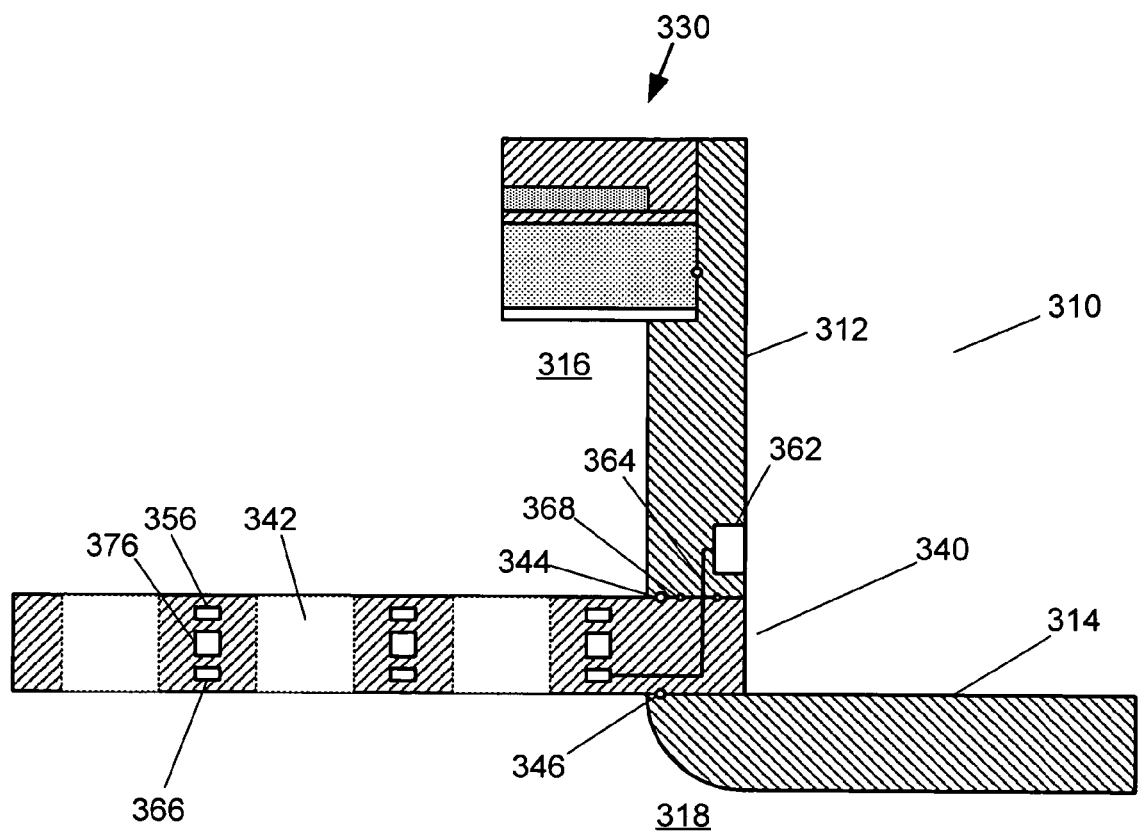
FIG. 11 provides an exploded view of a portion of a processing chamber according to another embodiment.

As illustrated in FIG. 11, the second gas is coupled to the second gas channel array 366 via a second array of gas lines 364. The second gas is coupled to the second array of gas lines 364 through a second array of gas fittings 362, which permits a point for coupling a second gas supply system, such as the second gas supply system 160 depicted in FIG. 1. For example, the second array of gas fittings 362 can be located in the upper chamber portion 312, and the second array of gas lines 364 can pass through the upper chamber portion 312 into the gas injection grid 340, whereby a second array of gas sealing devices 368 are utilized to prevent leakage of the second gas. For example, the second array of gas sealing devices 368 can include one or more elastomer O-rings.

Figure 12:
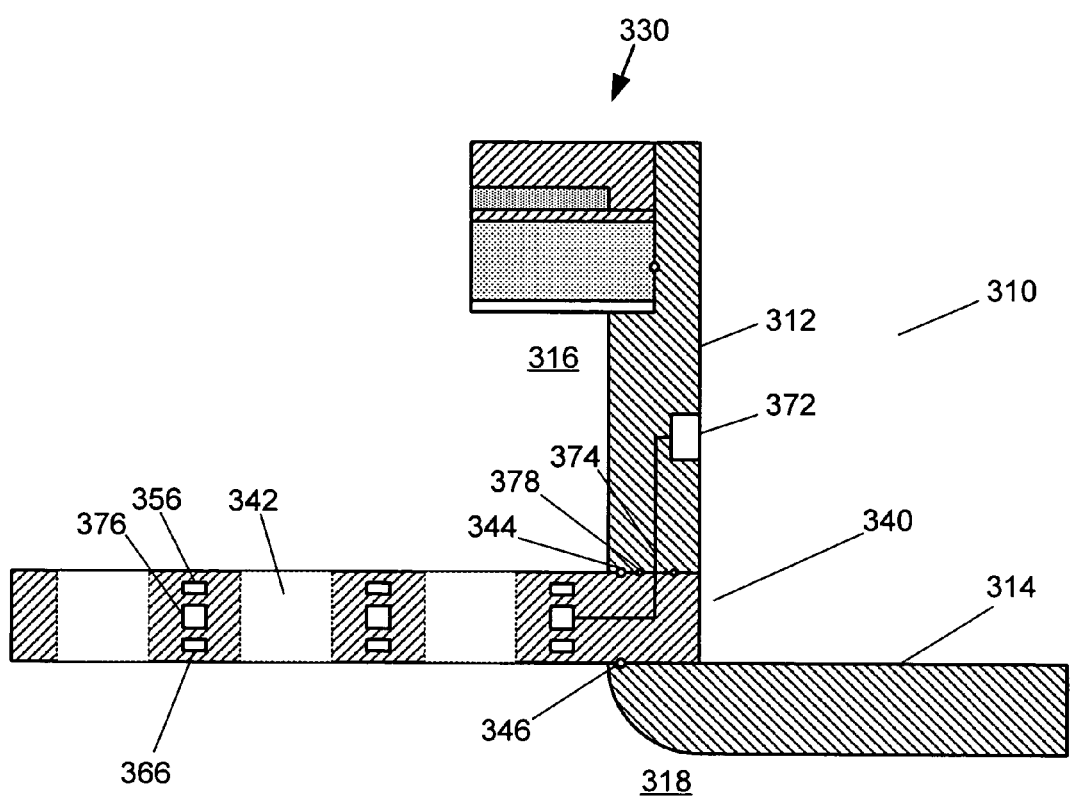
FIG. 12 provides an exploded view of a portion of a processing chamber according to another embodiment.

Additionally, as illustrated in FIG. 12, the heat transfer fluid is coupled to the fluid channel array 376 via an array of fluid lines 374. The heat transfer fluid is coupled to the array of fluid lines 374 through an array of fluid fittings 372, which permits a point for coupling a temperature control system, such as the temperature control system 170 depicted in FIG. 1. For example, the array of fluid fittings 372 can be located in the upper chamber portion 312, and the array of fluid lines 374 can pass through the upper chamber portion 312 into the gas injection grid 340, whereby an array of fluid sealing devices 378 are utilized to prevent leakage of the heat transfer fluid. For example, the array of fluid sealing devices 378 can include one or more elastomer O-rings.

Figure 13:
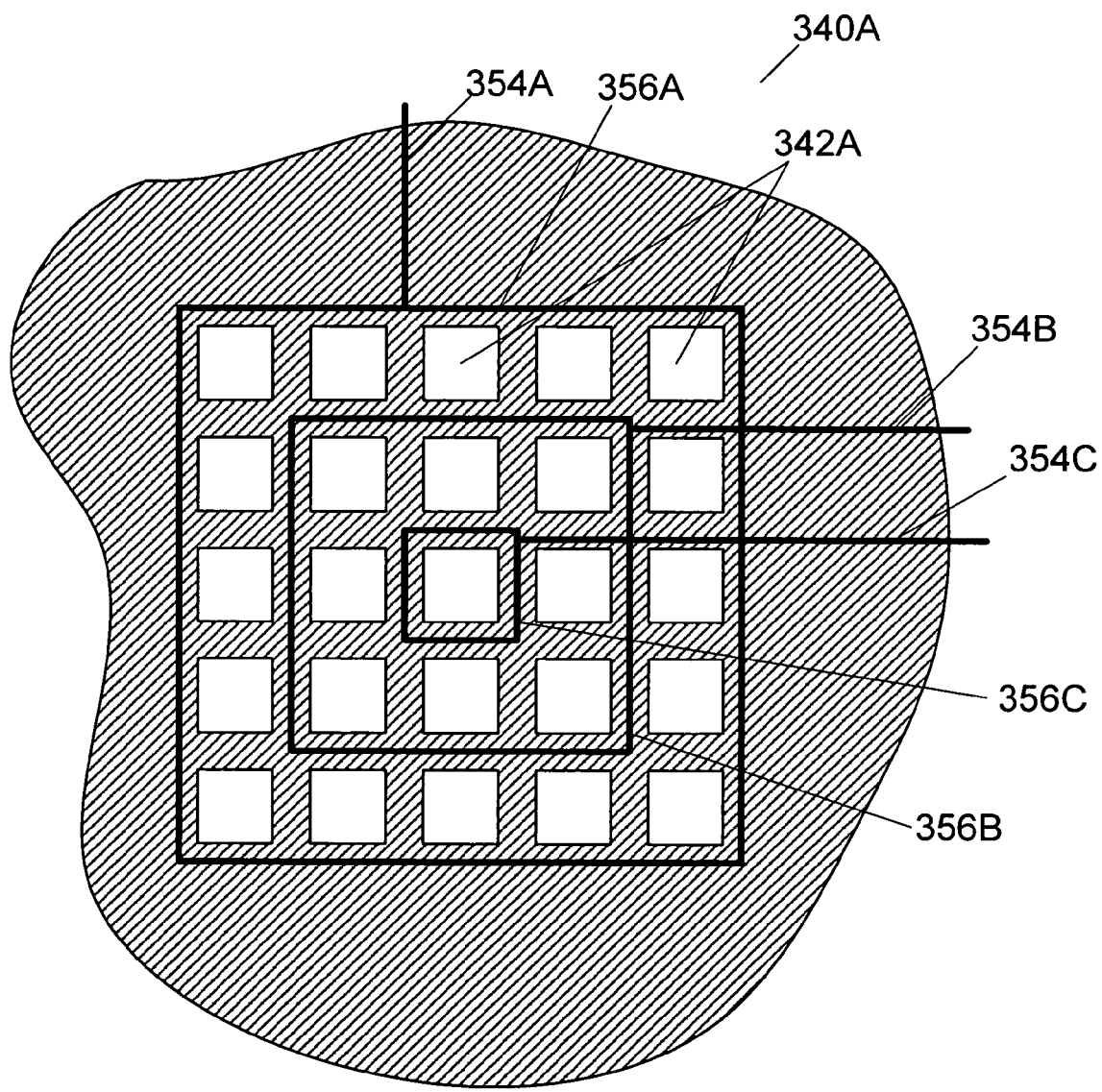
FIG. 13 illustrates a top view of a gas injection grid according to an embodiment.
Figure 14:
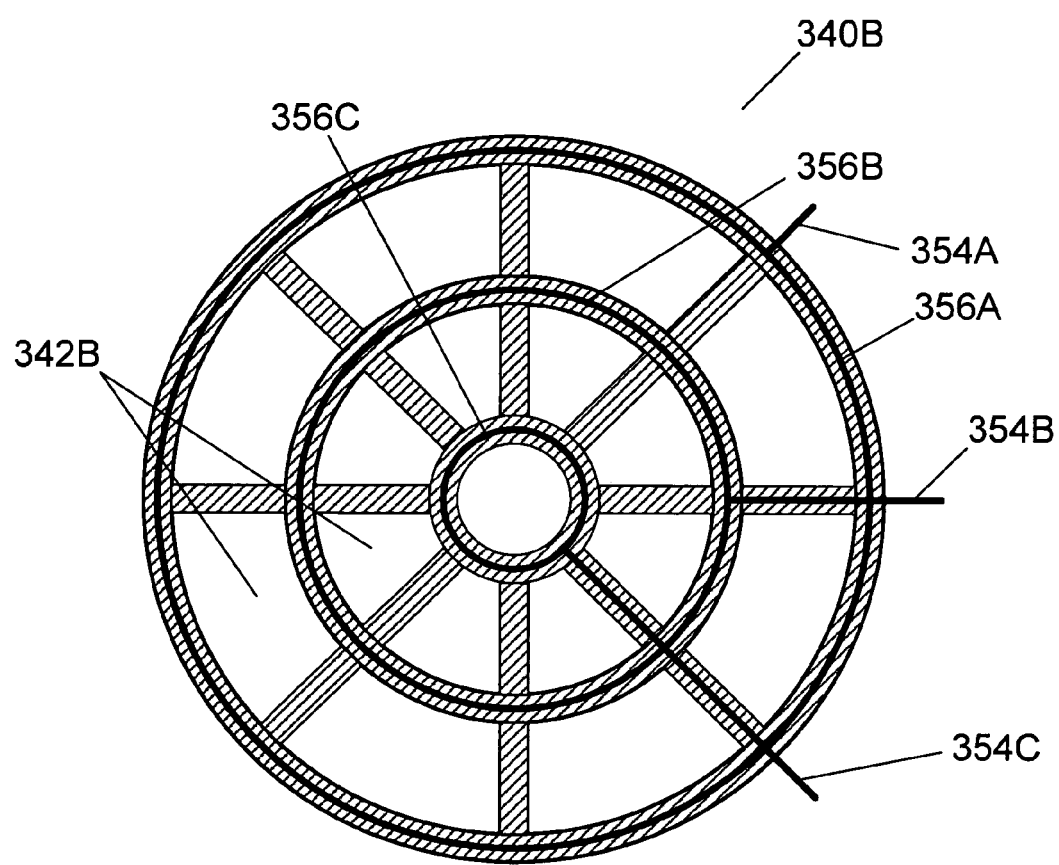
FIG. 14 illustrates a top view of a gas injection grid according to another embodiment.

Thus, as discussed above, one embodiment of the gas injection grid allows the first gas channel array, second gas channel array and/or third gas channel array to be used to provide spatial control of conditions in the process chamber. This spatial control can be used to replace or augment the control techniques of conventional process chambers described above in order to improve spatial control of processes at the substrate surface. FIGS. 13 and 14, illustrate a top down view of a gas injection grid for providing improved spatial control in accordance with two embodiments of the invention.

In FIG. 13, a gas injection grid 340A is depicted, wherein the gas injection grid comprises a rectangular distribution of passageways 342A, however, different shape passageways can be used. In the example of FIG. 13, the first gas is independently coupled to three gas channels 356A, 356B, and 356C via three separate gas lines 354A, 354B, and 354C. Similarly, in FIG. 14, a gas injection grid 340B is depicted, wherein the gas injection grid comprises a circular distribution of passageways 342B. For example, as shown in FIG. 14, the first gas is independently coupled to three gas channels 356A, 356B, and 356C via three separate gas lines 354A, 354B, and 354C. Although not shown, a separate mass flow controller, or separate array of mass flow controllers can be coupled to each gas line in FIGS. 13 and 14 to allow use of different gas compositions and/or flow rates across the gas injection grid 340A. While FIG. 13 shows closed rectangular loops and FIG. 14 shows closed circular loops that are concentrically spaced and each provided with a gas supply, the present invention is limited to this configuration. For example, each side of the rectangular gas channels in FIG. 13 may be provided with a separate gas supply in order to provide a greater degree of spatial control. Moreover, while FIGS. 13 and 14 are upper views of the gas injection grid 340 showing the gas channels and gas lines of the first gas, the spatial configuration of FIGS. 13 and 14 may be used for the second gas channel array or fluid channel array. In addition, different spatial control configurations can be used for each of these channel arrays if desired.

The gas injection grid 340 (340A, 340B), depicted in FIGS. 10 through 14 can be fabricated from a metal, such as aluminum, or a ceramic, such as alumina. Alternatively, the gas injection grid 340 can be fabricated from quartz, silicon, silicon carbide, silicon nitride, aluminum nitride, or carbon. Additionally, the gas injection grid 340 can be protected with a coating. For example, the coating can comprise one of a surface anodization, a coating formed using plasma electrolytic oxidation, or a spray coating such as a thermal spray coating. In an example, the coating can comprise at least one of $Al_2O_3$ and $Y_2O_3$. In another example, the coating comprises at least one of a III-column element (column III of periodic table) and a Lanthanon element. In another example, the III-column element comprises at least one of Yttrium, Scandium, and Lanthanum. In another example, the Lanthanon element comprises at least one of Cerium, Dysprosium, and Europium. In another embodiment, the compound forming the coating comprises at least one of Yttria ($Y_2O_3$), $Sc_2O_3$, $Sc_2F_3$, $YF_3$, $La_2O_3$, $CeO_2$, $Eu_2O_3$, and $DyO_3$. In another example, the coating can comprise Keronite (surface coating treatment commercially available from Keronite Limited, Advanced Surface Technology, PO Box 700, Granta Park, Great Abington, Cambridge CB1 6ZY, UK). In another example, the coating can comprise at least one of silicon, silicon carbide, alumina, Teflon, Vespel, or Kapton.

Referring again to FIG. 1, substrate 125 can be affixed to the substrate holder 120 via a mechanical clamping system, or an electrical clamping system, such as an electrostatic clamping system. Furthermore, substrate holder 120 can further include a cooling system including a re-circulating coolant flow that receives heat from substrate holder 120 and transfers heat to a heat exchanger system (not shown), or when heating, transfers heat from the heat exchanger system. Moreover, gas can be delivered to the back-side of substrate 125 via a backside gas system to improve the gas-gap thermal conductance between substrate 125 and substrate holder 120. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 125. In other embodiments, heating/cooling elements, such as resistive heating elements, or thermo-electric heaters/coolers can be included in the substrate holder 120, as well as the chamber wall of the processing chamber 110 and any other component within the plasma processing system 100.

Furthermore, substrate holder 120 can comprise an electrode through which radio frequency (RF) power is coupled to the processing plasma in process space 118. For example, substrate holder 120 can be electrically biased at a RF voltage via the transmission of RF power from a RF generator (not shown) through an impedance match network (not shown) to substrate holder 120. A typical frequency for the RF bias can range from about 0.1 MHz to about 100 MHz. RF bias systems for plasma processing are well known to those skilled in the art. Alternately, RF power is applied to the substrate holder electrode at multiple frequencies. Furthermore, impedance match network serves to improve the transfer of RF power to plasma in plasma processing chamber 10 by reducing the reflected power. Match network topologies (e.g. L-type, π-type, T-type, etc.) and automatic control methods are well known to those skilled in the art.

The temperature control system 170 of exemplary FIG. 1 can include components necessary for controlling the temperature of the gas injection grid 130. For example, the temperature control system 170 can include a heat exchanger for controlling the temperature of a heat transfer fluid, a pump and mass flow controller for delivering and controlling the flow rate of the heat transfer fluid to one or more channels in the gas injection grid 130, temperature sensing devices, a controller, etc.

The electric bias control system 175 can include components necessary for electrically biasing the gas injection grid 130. The electric bias can include a direct current (DC) electrical bias, or an alternating current (AC) electrical bias, or a combination thereof. For example, the electrical bias may include a radio frequency (RF) electric bias. The electric bias control system 175 can include a voltage/current source or power source, voltage or current or impedance measuring devices, a controller, etc.

The pumping system 180 of exemplary FIG. 1 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass.).

Still referring to FIG. 1, control system 190 can comprise a microprocessor, memory, and a digital I/O port capable of generating control voltages sufficient to communicate and activate inputs to plasma processing system 100 as well as monitor outputs from plasma processing system 100. Moreover, the controller 190 may be coupled to and may exchange information with the processing chamber 110, substrate holder 120, plasma source 130, gas injection grid 140, first gas supply 150, second gas supply 160, temperature control system 170, electric bias control system 175, and pumping system 180. For example, a program stored in the memory may be utilized to activate the inputs to the aforementioned components of the plasma processing system 100 according to a process recipe in order to perform an etching process, or a deposition process. One example of the controller 190 is a DELL PRECISION WORKSTATION 610™, available from Dell Corporation, Austin, Tex.

The controller 190 may be locally located relative to the plasma processing system 100, or it may be remotely located relative to the plasma processing system 100. For example, the controller 190 may exchange data with the plasma processing system 100 using at least one of a direct connection, an intranet, the Internet and a wireless connection. The controller 190 may be coupled to an intranet at, for example, a customer site (i.e., a device maker, etc.), or it may be coupled to an intranet at, for example, a vendor site (i.e., an equipment manufacturer). Additionally, for example, the controller 190 may be coupled to the Internet. Furthermore, another computer (i.e., controller, server, etc.) may access, for example, the controller 190 to exchange data via at least one of a direct connection, an intranet, and the Internet. As also would be appreciated by those skilled in the art, the controller 190 may exchange data with the plasma processing system 100 via a wireless connection.

Figure 15:
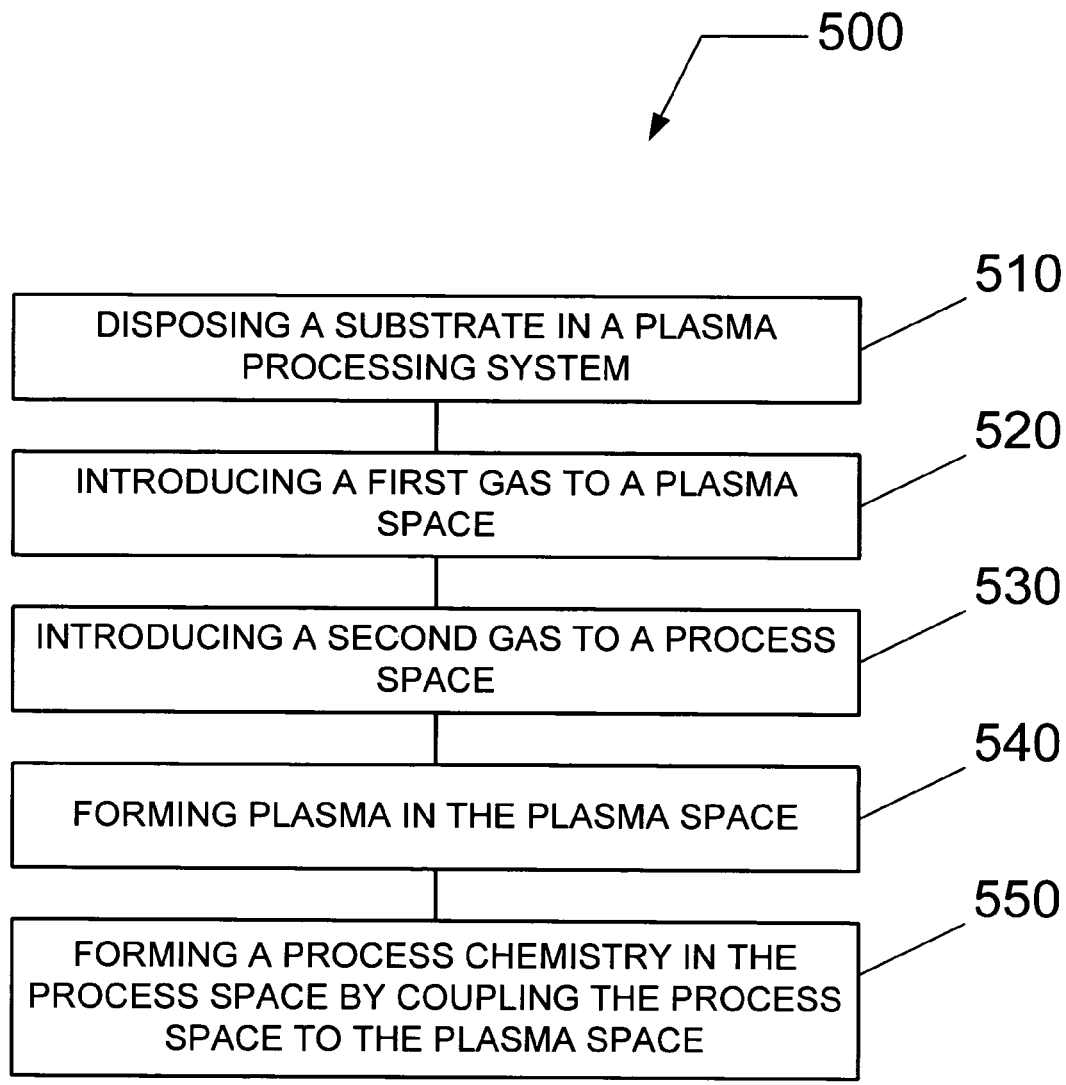
FIG. 15 provides a method of operating a plasma processing system according to an embodiment.

Referring now to FIG. 15, a method of operating a plasma processing system is described. The method includes a flow chart 500 beginning in 510 with disposing a substrate in a plasma processing system, such as the plasma processing system described in any of FIGS. 1 through 14. For example, a substrate can be disposed in a processing chamber having an upper chamber portion configured to define a plasma space and a lower chamber portion configured to define a process space.

In 520, a first gas is introduced to the plasma space from a gas injection grid positioned between the upper chamber portion and the lower chamber portion as described above, or by alternative gas injection schemes. The first gas comprises plasma forming gas, or an ionizable gas. For example, the first gas can include an inert gas, such as a Noble gas (i.e., helium, argon, xenon, krypton, neon). In 530, a second gas is introduced to the process space from the gas injection grid or any other gas injection scheme. The second gas comprises a process gas. For example, the second gas can include a halogen containing gas, such as $Cl_2$, HBr, $SF_6$, $NF_3$, etc. Additionally, for example, the second gas can include a $C_xF_y$ containing gas, such as $CF_4$, $C_4F_6$, $C_4F_8$, $C_5F_8$, where x and y are integers greater than or equal to unity. The first or second gas may be injected using spatial control techniques such as those described above.

In 540, plasma is formed in the plasma space from the first gas using a plasma source coupled to the upper chamber portion. The plasma source may be any of the sources described above. In 550, process chemistry is formed in the process space to treat the substrate by coupling the process space to the plasma space through a grid such as the gas injection grid, which allows diffusion of the plasma into the process space as described above.

Figure 16:
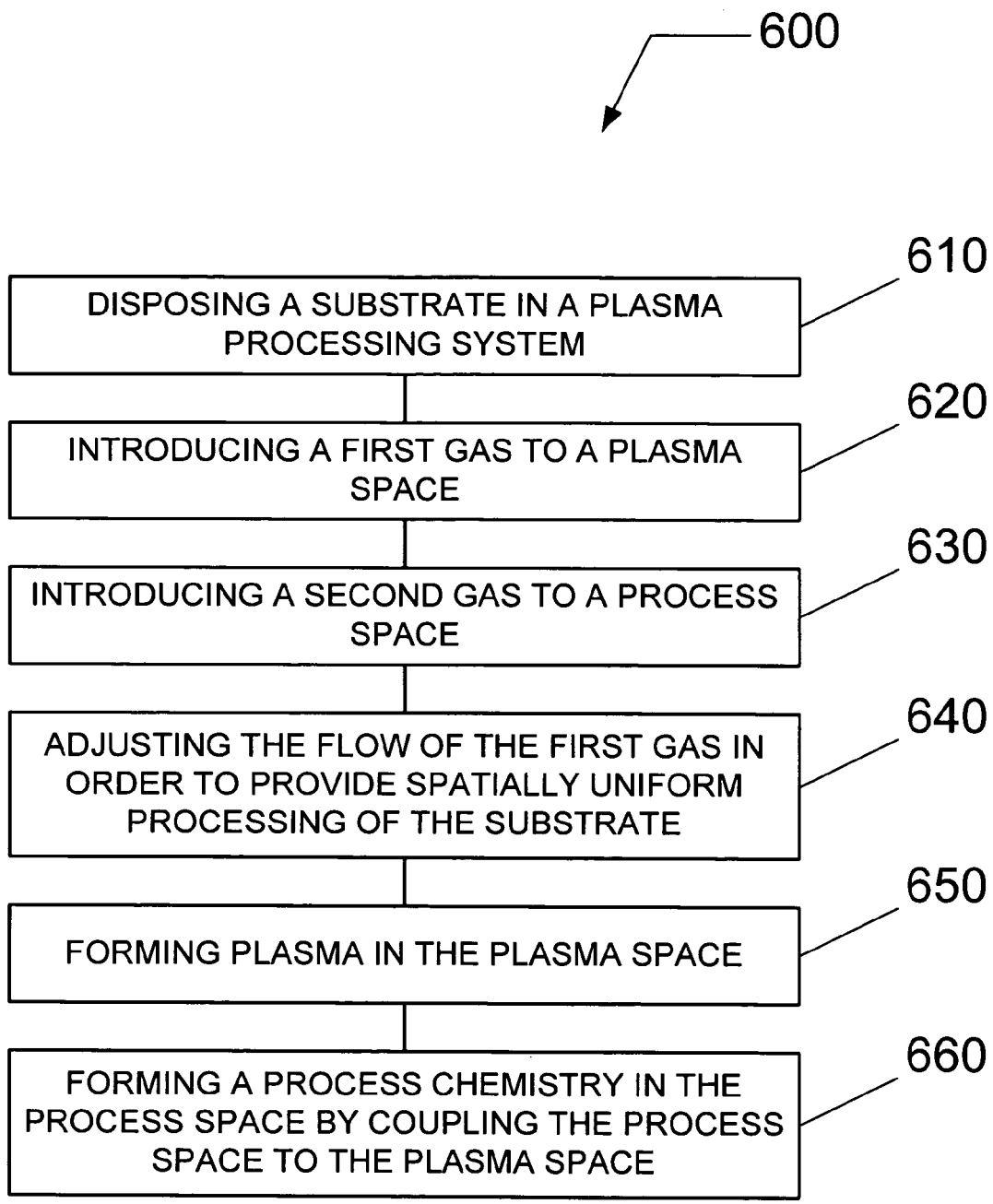
FIG. 16 provides a method of controlling the uniformity in a plasma processing system according to an embodiment.

Referring now to FIG. 16, a method of controlling the uniformity in a plasma processing system is provided according to an embodiment. The method comprises a flow chart 600 beginning in 610 with disposing a substrate in a plasma processing system, such as the plasma processing system described in any of FIGS. 1 through 14. For example, a substrate can be disposed in a processing chamber having an upper chamber portion configured to define a plasma space and a lower chamber portion configured to define a process space.

In 620, a first gas is introduced to the plasma space from a gas injection grid positioned between the upper chamber portion and the lower chamber portion. Optionally, the introduction of the first gas into the plasma space occurs from multiple zones formed in the gas injection grid as described above. Each zone for introducing the first gas includes a gas channel formed in the gas injection grid having one or more injection orifices, and the gas channel is independently coupled to a first gas supply system. Each zone can, for example, be formed in the radial directions, as illustrated in FIGS. 13 and 14, however, other spatial distributions can be used as described above. Such configurations allow for different flow rates and/or gas compositions across the grid.

In 630, a second gas is introduced to the process space from the gas injection grid. Optionally, the introduction of the second gas into the plasma space occurs from multiple zones formed in the gas injection grid as described above. Where the first gas is introduced without spatial control, the second gas is introduced with spatial control. It is only necessary that one of the first and second gasses is injected by a method for providing spatial control, however both gasses can be injected in this way. Moreover, spatial temperature control may be provided as discussed above. Each zone for introducing the second gas includes a gas channel formed in the gas injection grid having one or more injection orifices, and the gas channel is independently coupled to a second gas supply system. Each zone can, for example, be formed in the radial directions, similar to the scheme illustrated for the first gas in FIGS. 13 and 14.

In 640, the flow of the first gas into the plasma space is adjusted in order to provide spatial control of processing of the substrate. In a preferred embodiment, spatially uniform processing is achieved at the substrate. The local flow rate of the first gas into the plasma space can either raise or lower the local plasma density. For example, during high power operation of the plasma source, the hot plasma can be super heated, and therefore an increase in flow rate can lead to an excess of ionization of the first gas (i.e., plasma density increases). Alternatively, for example, during low power operation of the plasma source, the hot plasma is sustaining itself, and an increase in the flow rate can lead to quenching of the electron temperature (i.e., quenching of the collisions between neutrals and electrons), thus leading to a reduction in the plasma density. In one example, the gas injection grid can include, as described above, multiple zones for introducing the first gas into the plasma space. The flow rate for each zone can be utilized within the process recipe, for an etch or deposition process, in order to achieve the optimal spatial distribution of the plasma density in the plasma space for the specific process. For instance, a design of experiment (DOE) can be performed to determine the optimal set of flow rates for each of the zones to produce the optimal results.

Optionally, the flow of the second gas into the process space is adjusted in order to provide spatially uniform processing of the substrate.

In 650, plasma is formed in the plasma space from the first gas using a plasma source coupled to the upper chamber portion. In 650, process chemistry is formed in the process space to treat the substrate by coupling the process space to the plasma space through the gas injection grid.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of treating a substrate in a plasma processing system comprising:
   disposing said substrate in a processing chamber having a grid that separates a first chamber portion configured to define a plasma space from a second chamber portion configured to define a process space;
   introducing a first gas to said plasma space;
   introducing a second gas directly to said process space;
   forming a plasma in said plasma space from said first gas using a plasma source coupled to said first chamber portion such that said plasma source forms a wall of said first chamber portion and said plasma source is different than said grid; and
   forming a process chemistry for treating said substrate in said process space by providing said grid positioned between said first chamber portion and said second chamber portion such that said plasma can diffuse from said plasma space to said process space.

2. The method of claim 1, wherein said forming said process chemistry comprises forming process chemistry for performing an etch process.

3. The method of claim 1, wherein said forming said process chemistry comprises forming process chemistry for performing a deposition process.

4. The method of claim 1, wherein said forming said plasma using a plasma source comprises forming plasma using a surface wave plasma (SWP) source.

5. The method of claim 1, wherein said introducing said first gas comprises introducing a plasma forming gas.

6. The method of claim 1, wherein said introducing said first gas comprises introducing an inert gas.

7. The method of claim 1, wherein said introducing said first gas comprises introducing a Noble gas.

8. The method of claim 1, wherein said introducing said second gas comprises introducing a process gas for forming said process chemistry.

9. The method of claim 1, wherein said introducing said second gas comprises introducing a halogen containing gas.

10. The method of claim 1, wherein said introducing said second gas comprises introducing a $C_xF_y$ containing gas, where x and y are integers greater than or equal to unity.

11. The method of claim 1, wherein said introducing said second gas further comprises introducing an inert gas.

12. The method of claim 1, wherein said coupling said plasma space to said process space comprises forming one or more passageways within said gas injection grid.

13. The method of claim 1, wherein said introducing said first gas to said plasma space comprises injecting said first gas through a gas injection mechanism in said grid into the plasma space.

14. The method of claim 13, wherein said injecting said first gas comprises injecting the first gas through multiple zones of the gas injection grid in order to spatially control said plasma.

15. The method of claim 14, wherein said spatially controlling said plasma comprises injecting different compositions of said first gas through said multiple zones of the gas injection grid in order to spatially control said plasma.

16. The method of claim 14, wherein said spatially controlling said plasma comprises injecting said first gas at different gas flow rates through said multiple zones of the gas injection grid in order to spatially control said plasma.

17. The method of claim 14, wherein said spatially controlling said plasma comprises introducing said first gas from a concentric pattern of multiple plasma zones in said gas injection grid.

18. The method of claim 17, wherein said introducing said first gas from said concentric zones includes introducing said first gas from concentric rectangular zones.

19. The method of claim 17, wherein said introducing said first gas from said concentric zones includes introducing said first gas from concentric circular zones.

20. The method of claim 1, wherein said injecting said first gas at different gas flow rates comprises setting a flow rate for each plasma zone in a process recipe configured to produce a substantially uniform process on said substrate.

21. The method of claim 20, wherein said setting said flow rate for each plasma zone comprises performing a design of experiment (DOE) to determine an optimal set of flow rates for achieving said substantially uniform process on said substrate.

22. The method of claim 1, wherein said introducing said second gas to said plasma space comprises injecting said second gas through a gas injection mechanism in said grid into the process space.

23. The method of claim 22, wherein said injecting said second gas comprises injecting the second gas through multiple zones of the gas injection grid in order to spatially control said process space.

24. The method of claim 23, wherein said spatially controlling said process space comprises injecting different compositions of said second gas through said multiple zones of the gas injection grid in order to spatially control said process space.

25. The method of claim 23, wherein said spatially controlling said process space comprises injecting said second gas at different gas flow rates through said multiple zones of the gas injection grid in order to spatially control said process space.

26. The method of claim 23, wherein said spatially controlling said process space comprises introducing said second gas from a concentric pattern of multiple plasma zones in said gas injection grid.

27. The method of claim 26, wherein said introducing said second gas from said concentric zones includes introducing said second gas from concentric rectangular zones.

28. The method of claim 26, wherein said introducing said second gas from said concentric zones includes introducing said second gas from concentric circular zones.

29. The method of claim 25, wherein said injecting said first gas at different gas flow rates comprises setting a flow rate for each plasma zone in a process recipe configured to produce a substantially uniform process on said substrate.

30. The method of claim 29, wherein said setting said flow rate for each plasma zone comprises performing a design of experiment (DOE) to determine an optimal set of flow rates for achieving said substantially uniform process on said substrate.

31. The method of claim 30, further comprising flowing a temperature control fluid through said grid to control a temperature of said grid.

32. The method of claim 31, wherein said flowing a temperature control fluid comprises flowing said fluid through multiple zones of the grid in order to spatially control at least one of said plasma space or said process space.

33. The method of claim 1, wherein said forming a plasma in said plasma space comprises using a surface wave plasma SWP source to form said plasma from said first gas.

34. The method of claim 33, wherein said using a SWP source comprises adjusting at least one of a number, a distribution or a size of slots in a slot antenna of said SWP source in order to control spatial uniformity of said plasma in said plasma space.

35. The method of claim 33, further comprising providing a cover plate for protecting said SWP source from said plasma.

36. The method of claim 33, further comprising providing a mode scrambler coupled to said SWP source in order to suppress mode hops in said plasma.

37. The method of claim 36, further comprising adjusting at least one of a size, a geometry, a number or a distribution of blind holes in said mode scrambler in order to control spatial uniformity of said plasma in said plasma space.

38. A method of treating a substrate in a plasma processing system comprising:
   disposing said substrate in a processing chamber having a first chamber portion configured to define a plasma space and a second chamber portion configured to define a process space;
   providing a gas injection grid positioned between said first chamber portion and said second chamber portion;
   introducing a first gas from said gas injection grid to said plasma space;
   introducing a second gas from said gas injection grid directly to said process space;
   forming a plasma in said plasma space from said first gas using a plasma source coupled to said first chamber portion such that said plasma source forms a wall of said first chamber portion and said plasma source is different than said gas injection grid; and
   forming a process chemistry for treating said substrate in said process space by providing said gas injection grid positioned between said first chamber portion and said second chamber portion such that said plasma can diffuse from said plasma space to said process space.

* * * * *